United States Patent [19]

Huschka et al.

[11] Patent Number: 4,869,755

[45] Date of Patent: Sep. 26, 1989

[54] ENCAPSULATION OF A PHOTOVOLTAIC ELEMENT

[75] Inventors: Hans Huschka; Winfried Hoffman, both of Hanau, Fed. Rep. of Germany

[73] Assignee: Nukem GmbH, Hanau, Fed. Rep. of Germany

[21] Appl. No.: 218,854

[22] Filed: Jul. 14, 1988

[30] Foreign Application Priority Data

Jul. 30, 1987 [DE] Fed. Rep. of Germany ..... 37225338

[51] Int. Cl.$^4$ .................... H01L 31/00; H01L 31/18
[52] U.S. Cl. .................... 136/259; 136/251; 136/256; 437/2; 437/235; 437/241; 437/215; 357/30; 357/72

[58] Field of Search .................. 136/251, 256, 259; 427/39, 45.1, 51; 437/2-5, 241, 225, 235; 357/72, 30 J

[56] References Cited

FOREIGN PATENT DOCUMENTS 59-112660  6/1984  Japan .................... 136/251

OTHER PUBLICATIONS

M. J. Mirtich et al., Thin Solid Films, vol. 131, pp. 245-254 (1985).

Primary Examiner—Aaron Weisstuch
Attorney, Agent, or Firm—Beveridge, DeGrandi & Weilacher

[57] ABSTRACT

The encapsulation of a photovoltaic element is described in which the outer surface is provided with a two layer protective film comprising a carbon film and a dielectric silicon compound film.

5 Claims, 1 Drawing Sheet

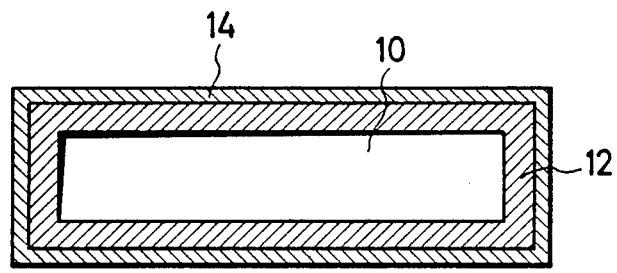

ENCAPSULATION OF A PHOTOVOLTAIC ELEMENT

FIELD AND BACKGROUND OF THE INVENTION

The invention relates to an encapsulation of a photovoltaic element such as a solar cell or solar cell module, the free outer surface at least of said element being covered by a transparent protective film comprising a dielectric silicon compound, and to a method for implementation of an appropriate encapsulation.

Solar cells, or modules or panels consisting thereof, for photovoltaic current generation are used both indoors and outdoors. Their main application is, however, employment in the open, for example in energy generation for single-family houses, pumps, refrigeration units, boats, etc. This open-air use subjects them to a variety of disturbing factors, for example weather, dust, dirt, etc. For this reason the current-generating and -discharging components and the connections between the individual cells must be protected from such effects. A known method, for example, is to encapsulate solar cells by adhering special glass or quartz glass sheets, transparent plastic, or plastic-coated metal foils onto the rear of the cells. These covering panels between which the solar cell lies are surrounded by a frame and sealed. Between the covering panels and the cells transparent organic materials can be inserted in addition. The material must be selected on the basis of the following considerations:

good optical properties (translucency, refractive index), which must not be susceptible to degradation by sunlight, mechanical and thermal properties (breaking strength, impact resistance, temperature resistance, thermal expansion, tightness)

resistance to mechanical and chemical effects (erosion, corrosion, impurities), resistance to all weather conditions.

Appropriate encapsulation techniques have considerable drawbacks resulting both from the large number of different materials used that come into contact with one another, and from expensive and complicated production technologies. Additional problems arise when the size of the surface to be encapsulated or sealed increases. Since compromises also have to be made as regards material selection, there is a risk of glass breakage or lack of resistance by the organic material to long-term light and environmental effects. In addition, the varying thermal properties of the adjacent materials can cause breakage and damage in the photovoltaic cells and modules in the event the latter are used under high temperature fluctuations.

SUMMARY OF THE INVENTION

The object of the present invention is to provide an encapsulation for a photovoltaic element of the type mentioned at the outset that has a high resistance to mechanical and chemical effects and to weather influences, while at the same time ensuring good optical, mechanical and thermal properties. Moreover, the encapsulation manufacturing process should be simple and inexpensive.

The object is attained in accordance with the invention by the outer surface of the photovoltaic element being covered with two films arranged one above the other, of which one film comprises a dielectric silicon compound and the other carbon which is applied at least to the free outer surface of the photovoltaic element at temperatures below 500° C. The external film preferably comprises of carbon and the inner film the dielectric silicon compound, preferably silicon nitride or silicon oxynitride. In the embodiment the thickness of each film is less than 10 μm, and the sum of both films should be less than 15 μm. An optimum encapsulation is achieved in particular when the thickness of the film comprising carbon is less than 1 μm and that of the silicon compound film is less than 5 μm.

A method for encapsulation of a photovoltaic element such as a solar cell or solar cell module, whereby at least the free outer surface of said element is covered with a transparent protective film comprising a dielectric silicon compound, is distinguished in that by means of plasma- or microwave-assisted deposition from the gas phase (CVD) the dielectric silicon compound in the form of a silicon nitride or silicon oxynitride film is applied to the photovoltaic element at a maximum temperature of 500° C., and an amorphous carbon film is applied to the photovoltaic element at a maximum temperature of 200° C. Here, deposition in a plasma glow discharge takes place preferably when forming the film of amorphous carbon at a temperature $T_1$ where $T_1 \leq 200°$ C., preferably $60° C. \leq T_1 \leq 100°$. Crystalline carbon is deposited in a microwave plasma CVD facility at temperatures $T_2$, with $T_2 \leq 1000°$ C., preferably $750° C. \leq T_2 \leq 950°$. If the film comprises a dielectric silicon compound, deposition from a silane-ammonia plasma takes place at a temperature $T_3$ of the element with $230° C. \leq T_3 450°$ C., preferably $260° C. \leq T_3 \leq 280°$.

According to the invention, photovoltaic elements such as solar cells or solar cell modules are encapsulated or sealed, giving protection against both corrosion and abrasion and if necessary being applicable to surfaces of any size in a continuous process. An incidental effect thereof is an adhesive strength and compatability which exhibits a high degree of resistance to weather influences, mechanical and chemical effects, and thermal influences, without detriment to transparency. An advantage of the process is that it is possible to produce large-area modules, with hardly any limits being placed on the areas to be encapsulated or sealed.

Further details and advantages of the invention are made clear in the claims and the features to be found therein, singly and/or in combination.

BRIEF DESCRIPTION OF THE DRAWING

Further details, advantages and features of the invention are given in the following description of an embodiment shown in the drawing, in which the only figure shows a photovoltaic element (10) in a purely diagrammatic form.

DETAILED DESCRIPTION OF THE PREFERRED EMBODIMENT

The photovoltaic element (10) can be a thin-film cell on the basis of amorphous silicon or other semiconductor materials or thick film cells directly absorbant in the physical sense on the basis of mono- or polycrystalline silicon or other semiconductor materials indirectly absorbent in the physical sense. The photovoltaic element has a known structure as described, for example, on the basis of a large number of examples in "Lippold/-

Trogisch/Friedrich, Solartechnik, Verlag fur Architektur und technisches Wissen, 1974".

According to the invention, the solar cell (10) is encapsulated over its whole area, namely by the protective films (12) and (14) in the embodiment. Films (12) and (14) in accordance with the invention are films of amorphous carbon (a-C:H), crystalline carbon (c-C), amorphous silicon oxynitride (a-SiN$_x$:H) or crystalline silicon nitride which are deposited from the gas phase on the outer surface of the photovoltaic element (10).

Deposition of the films (12) and (14) can now be described in detail on the basis of the following examples.

EXAMPLE A

The finished solar cell (10)—which may also be a solar cell module—is arranged in a reaction space in order to be coated with amorphous carbon in a plasma glow discharge. For this purpose high frequency in a range from 2.3 to 13.56 MHz is capacitively coupled. The solar cell (10) is located on an ungrounded electrode and receives a bias voltage $V_e$ in the range from $-10$ V to $-900$ V. The parameters should preferably be adjusted so that the bias voltage $V_e$ settles in the range $-100$ V. The reaction container is connected to a hydrocarbon source such as methane, ethane, butane, propane, acetylene, ethylene, propylene, cyclohexane, octane, decyl hydride, xylan, naphthalene or similar compound, with the pressure in the reaction space being set to approx. 5 Pa ($=5\times10^{-5}$ bars). The deposition rate should be between 0.15 and 3 nm/s depending on the hydrocarbon used. In tests carried out the electrode spacing was 3 cm and the high-frequency output 1 W/cm$^2$ for a solar cell area of 100 cm$^2$. Under these conditions it was possible to achieve films with a thickness in the range of 0.5 to 10 $\mu$m, preferably 1 to 2 $\mu$m, with the substrate temperature being around 80° C. As a result it was found that an adequate scratch-resistance and hardness of the film (1000 Hv) together with a satisfactorily wide band gap (1.8 eV) was obtained to minimize optical losses. Furthermore, the selected deposition parameters are distinguished by the fact that the films generated with a refractive index n of around 2.0 serve as antireflection coatings.

A film made of a dielectric silicon compound is then applied to the carbon film, using the following procedure as an example.

EXAMPLE B

Instead of a protective film comprising amorphous carbon, an unencapsulated solar cell was first coated on all sides with amorphous silicon oxynitride as a protection against external effects. For this purpose the solar cell was subjected, in a graphite boat coated with pyrogenic graphite and located inside a quartz tube, to a silane-ammonia plasma. The gas throughputs selected were 230 c.c./min for silane and 1750 c.c./min for ammonia. The pressure in the reaction container during deposition amounted to approx. 100 Pa ($=0.8$ Torrs). The temperature of the solar cell (substrate temperature) was set between 200° C. and 450° C., preferably between 260° C. and 280° C. The high-frequency output in the range between 50 and 500 KHz is between 50 and 1000 W/m$^2$. A typical result was 80 W/m$^2$ at a frequency of 400 KHz. Under these parameters silicon nitride films with thicknesses between 100 and 10,000 nm were obtained. The film thicknesses should preferably be between 1000 and 1500 nm. The refractive index was 1.95, so that not only a diffusion barrier against harmful environmental effects was obtained, but also an anti-reflection coating.

The subsequent film of carbon can be applied in accordance with Example A.

EXAMPLE C

In accordance with a further embodiment the silicon nitride film is applied directly to the solar cell with a thickness of between 1000 and 5000 nm. To increase the mar-resistance and the hardness properties an amorphous carbon film of between 300 and 800 nm thickness was then applied. The various films were applied in accordance with the embodiments A and B.

EXAMPLE D

Instead of the amorphous film mentioned in the example an appropriate crystalline film can also be used. The corresponding crystalline film thickness must be increased by a factor 2–10, preferably 4–6. (Film thicknesses of the crystalline silicon nitride film in the range 2 and 50 $\mu$m and of the crystalline carbon film in the range 0.6 and 8 $\mu$m).

We claim:

1. A photovoltaic element which is covered by two transparent protective films arranged one above the other to provide an inner film and an outer film, the inner film comprising a dielectric silicon compound and the outer film comprising carbon, the thickness of each film being less than 10 $\mu$m, and the combined thickness of the two films being less than 15 $\mu$m.

2. A photovoltaic element according to claim 1, wherein the film comprising carbon is amorphous or crystalline.

3. A photovoltaic element according to claim 2, wherein the film comprising amorphous carbon has a thickness of less than, 1 $\mu$m, and the thickness of the silicon compound film is less than 5 $\mu$m.

4. A photovoltaic element according to claim 1, wherein the two films completely cover the outer surface of the photovoltaic element.

5. A method for encapsulation of a photovoltaic element by covering the outer surface of the element by two transparent protective films arranged, one above the other, the method comprising the steps of:

first performing a plasma or microwave-assisted deposition from a gas phase (CVD) to apply a dielectric silicon compound in the form of a silicon nitride or silicon oxynitride film at a maximum temperature of 500° C. to the photovoltaic element, and applying an amorphous carbon film at a maximum temperature of 200° C. over the inner film to form the outer film.

* * * * *